(12) United States Patent
Yeh

(10) Patent No.: US 9,633,349 B1
(45) Date of Patent: Apr. 25, 2017

(54) 3D PACKAGING OF POWER AMPLIFIER DICE APPARATUS AND ARTICLES OF MANUFACTURE

(71) Applicant: Jin-Fu Yeh, Pasadena, CA (US)

(72) Inventor: Jin-Fu Yeh, Pasadena, CA (US)

(73) Assignee: Tubis Technology Inc., Pasadena, CA (US)

( * ) Notice: Subject to any disclaimer, the term of this patent is extended or adjusted under 35 U.S.C. 154(b) by 59 days.

(21) Appl. No.: 14/788,465

(22) Filed: Jun. 30, 2015

Related U.S. Application Data

(60) Provisional application No. 62/168,061, filed on May 29, 2015.

(51) Int. Cl.
| | |
|---|---|
| *H03F 3/14* | (2006.01) |
| *G06Q 20/34* | (2012.01) |
| *G06K 7/08* | (2006.01) |
| *G06K 19/077* | (2006.01) |
| *G06K 7/10* | (2006.01) |

(52) U.S. Cl.
CPC ........... *G06Q 20/341* (2013.01); *G06K 7/084* (2013.01); *G06K 7/10148* (2013.01); *G06K 19/077* (2013.01); *G06Q 20/347* (2013.01)

(58) Field of Classification Search
CPC . H03F 3/68; H03F 3/211; H03F 3/602; H03F 3/605; H03F 3/195; H03F 2003/45013; H03F 3/187; H03F 3/213; H03F 3/347; H01P 5/12
USPC .................................................. 330/295, 307
See application file for complete search history.

(56) References Cited

U.S. PATENT DOCUMENTS

2011/0018651 A1* 1/2011 Ikeda ................ H01J 37/32192
333/118

\* cited by examiner

*Primary Examiner* — Khanh V Nguyen
(74) *Attorney, Agent, or Firm* — Patentry

(57) ABSTRACT

An article of manufacture provides a compact assembly of power amplifiers in series and in parallel. A plurality of radial power splitters and radial power combiners couple surface mounted power amplifier dice into a power platter. Thermal conduction probes chained through the power platters remove heat from the vicinity of the power amplifier dice. Surface mounted power amplifier dice may be enclosed within a matched pair of power platters. Stackable power platters may be assembled to form a 3D power amplifier pile.

8 Claims, 3 Drawing Sheets

3D PACKAGING OF POWER AMPLIFIER DICE APPARATUS AND ARTICLES OF MANUFACTURE

RELATED APPLICATIONS

This is a non-provisional application which benefits from provisional application 62168061 filed May 29, 2015 and fully incorporates it entirely by reference.

BACKGROUND

As is known, digital and analog circuitry continues to shrink but power amplifiers cannot keep up with finer resolutions. What is needed is more efficient power amplifiers with small footprints.

SUMMARY

Figure 1:
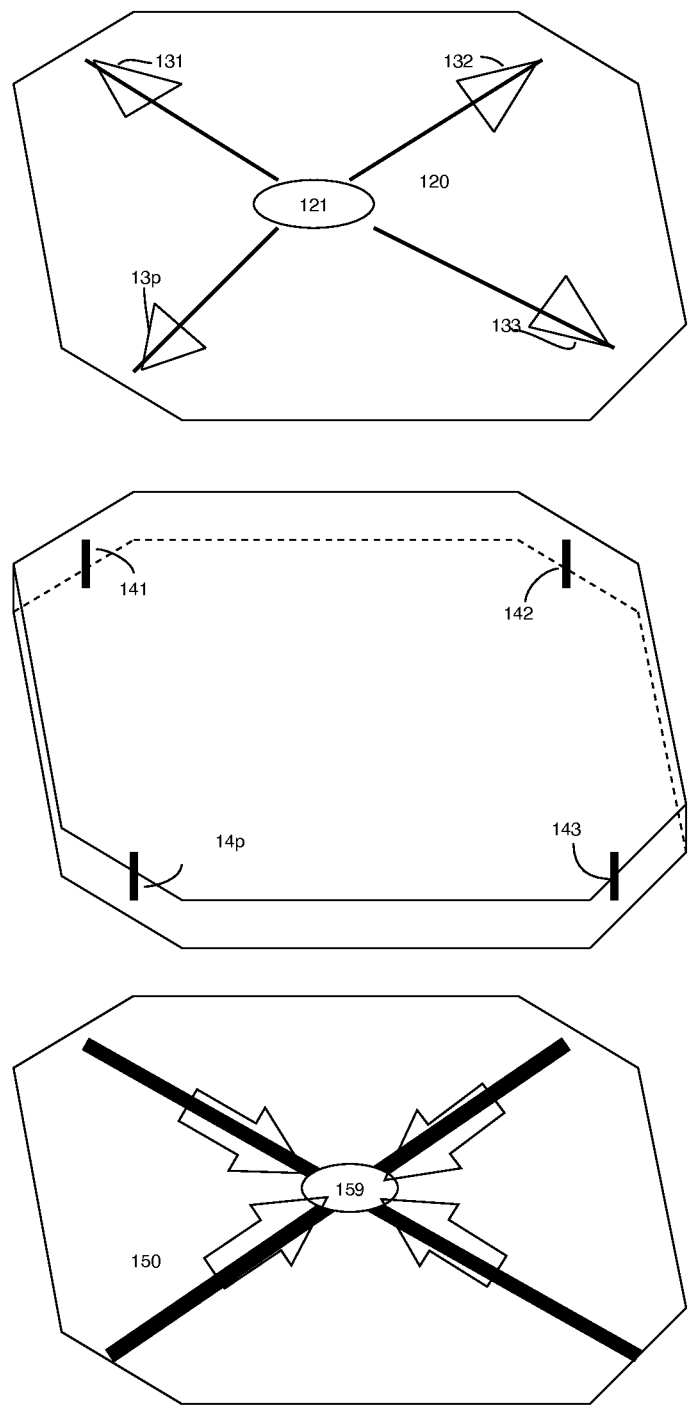
FIG. 1 is a schematic shown in perspective view of a 3D power amplifier circuit.

Referring to FIG. 1 a perspective view of a circuit 100 shows a splitter 120 is vertically arranged with respect to a combiner 150. Either can be above the other with the beneficial effect that the footprint of their area are equal to whichever is larger. Coupled between the splitter and the combiner are a plurality of p power amplifier dice 131-13$p$. The die are coupled by vias 141-14$p$ which are substantially orthogonal to the surface on which the die are mounted. The splitter is configured radially with its input port 121 at its center. The combiner is configured radially with its output port 159 at its center so that it can be one of a stack.

An article of manufacture provides a compact assembly of power amplifiers in series and in parallel. A plurality of radial power splitters and radial power combiners couple surface mounted power amplifier dice into a power platter. Thermal conduction probes chained through the power platters remove heat from the vicinity of the power amplifier dice. Surface mounted power amplifier dice may be enclosed within a matched pair of power platters. Stackable power platters may be assembled to form a power amplifier pile.

For the glass substrate packaging, a pair of 1–n splitter and n–1 combiner (overlapping, that is superposed on different planes of glass substrate) provides smaller size of the glass substrate and resulting reduced loss compared with conventional non-superposed splitters and combiners.

DETAILED DISCLOSURE OF EMBODIMENTS

Figure 2:
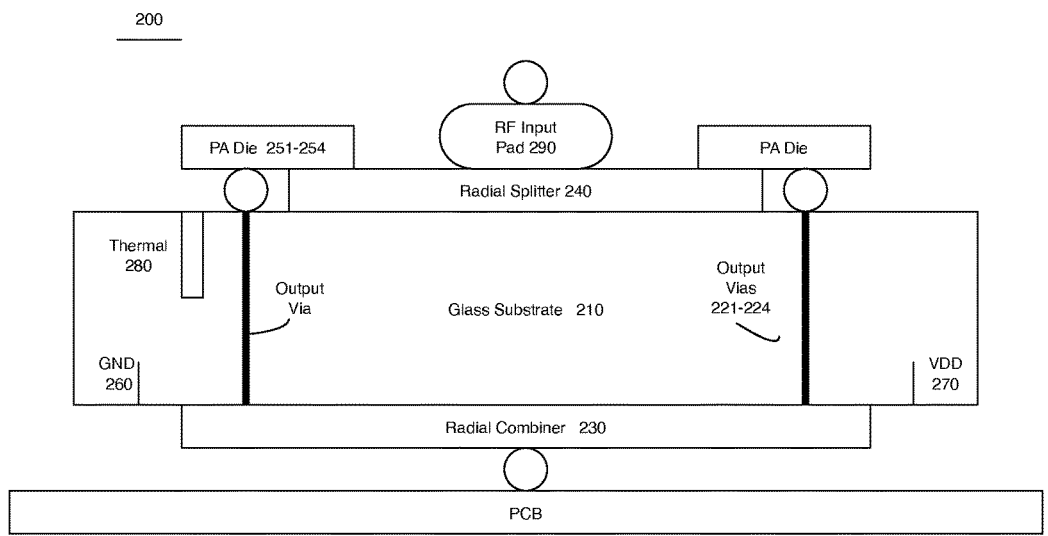
FIG. 2 is a side view of an article of manufacture. A 3D stack embodiment is shown as FIG. 3.

Referring now to FIG. 2, one aspect of the invention is an article of manufacture 200 to provide a stackable power amplifier cell having a glass substrate 210 comprising a plurality of power output vias 221-224 (output vias); the vias coupled to a radial combiner 230 lithographically fabricated on the output surface of the glass substrate, whereby the center of the radial combiner provides an output port for the article suitable for soldering to a printed circuit board; a radial splitter 240 (splitter) lithographically fabricated on the input surface of the glass substrate; plurality of power amplifier dice 251-254 surface mounted to the radial splitter and to the output vias; an RF input pad 290 surface mounted to the center of the splitter, suitable for soldering to a center of a radial combiner of an other stackable power amplifier cell; and, a plurality of other vias for transferring ground 260, VDD 270, and thermal conduction 280 across the glass substrate.

A system includes at least one radial signal splitter coupled to its input port, at least one radial signal combiner coupled to its output port, and a plurality of surface mount power amplifier dice.

For improved glass substrate packaging, the article includes 1-4 splitter and 4-1 combiner (superposed on diverse planes) on glass substrate, similar to on-chip splitter/combiner. This preferred embodiment for 3D glass packaging shrinks the size of the glass substrate and reduces loss.

Figure 3:
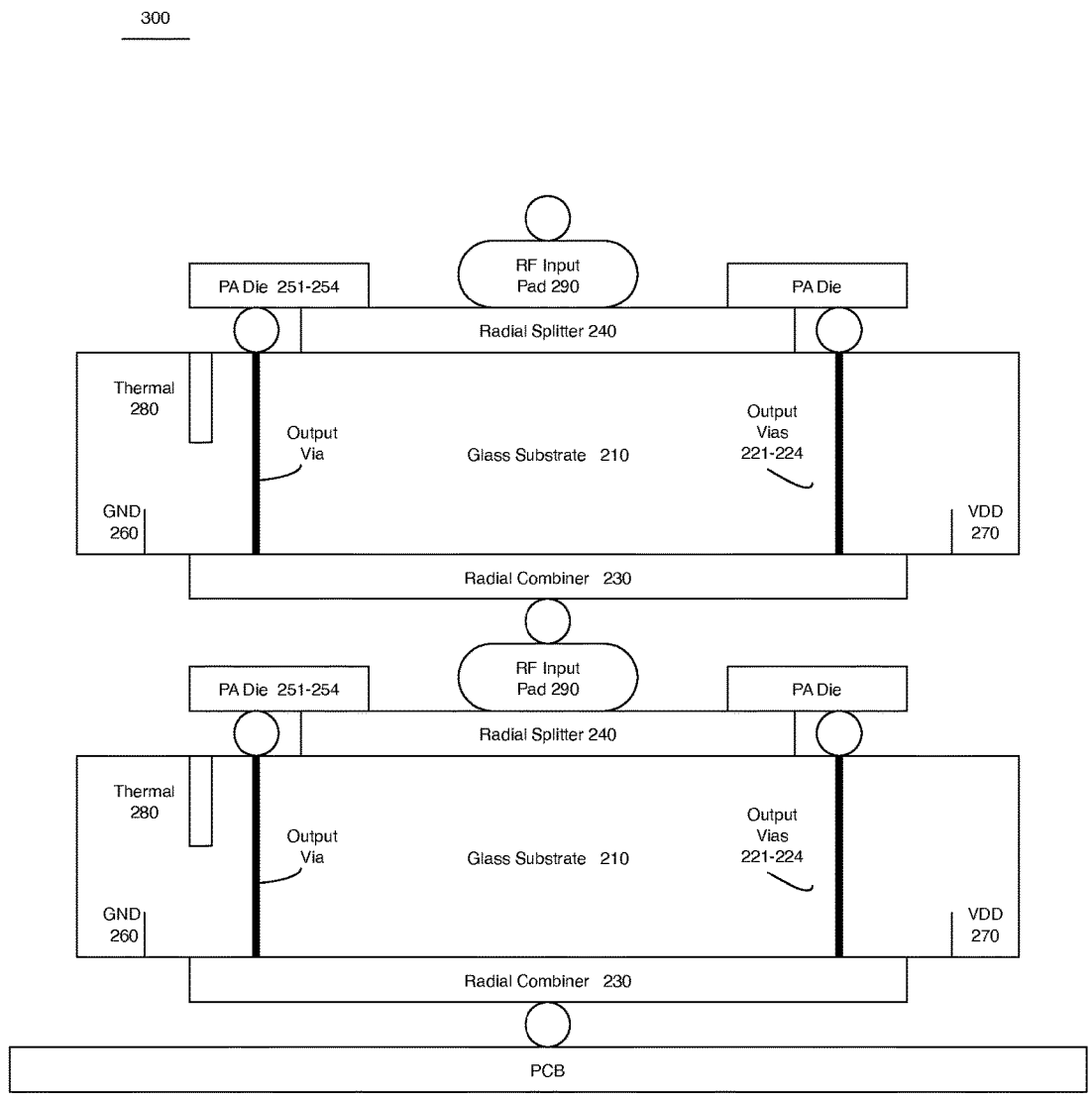

Referring now to the FIG. 3, a plurality of power platters may be stacked into a power pile which has the same footprint as a single power platter. It is understood that the combiners and splitters may be fabricated as thick films or thin films which have been illustrated not to scale in order to be visible and more easily understood.

In a first embodiment, the article of manufacture has multiple PA dies flip-chip mounted on glass substrates, input combiner on one (top) glass substrate and output combiner on the another (bottom) glass substrate. RF output, RF ground bumps, DC bumps, are provided on the glass substrate.

In a second embodiment, multiple PA dies are flip-chip mounted on a single glass substrates, input combiner on one top metal of the glass substrate and output combiner on the another (bottom) metal layer glass substrate. RF output, RF ground bumps, DC bumps are fabricated on the glass substrate.

Another embodiment of the invention combines stacked up glass substrate with PA dies (from embodiment 1 or 2) vertically to form multiple stack-up structure (of embodiment 1 or 2).

In a third embodiment, the power amplifier chips can themselves by fabricated as a 3D process. Then Multiple 3D PA dies flip-chip mounted on glass substrates, input combiner on one (top) glass substrate and output combiner on the other (bottom) glass substrate. RF output, RF ground bumps, DC bumps, are provided on the glass substrate.

In another embodiment, multiple PA dies are flip-chip mounted on a single glass substrates, input combiner on one top metal of the glass substrate and output combiner on the other (bottom) metal layer glass substrate. Add RF output, RF ground bumps, DC bumps, on the glass substrate.

In another embodiment, stacked up glass substrate with PA dies (from embodiment 1 or 2) vertically to form multiple stack-up structure (of embodiment 4 or 5).

In an embodiment, heat dissipation is done (using thermal vias) to bring it down to the bottom bumps.

In an embodiment, heat dissipation can be done (using thermal vias) to bring it up to top layer metal (air cooling).

One aspect of the invention is an article of manufacture which includes a plurality of radio frequency (RF) power amplifier dice; at least one coaxially arranged pair of a signal splitter, and a signal combiner; and at least one glass substrate on which is surface mounted all or some of the plurality of power amplifier dice.

In an embodiment, the article also has at least one thermal via to conduct heat away from the vicinity of the power amplifier dice.

In an embodiment, a first glass substrate includes a first metal layer configured as the signal splitter and a second metal layer configured as the signal combiner.

In an embodiment, a first glass substrate includes a first metal layer configured as the signal splitter; and a second glass substrate comprises a second metal layer configured as the signal combiner.

In an embodiment, a first glass substrate has an output surface on which is surface mounted the plurality of power amplifier dice and an input surface.

In an embodiment, the input surface has a metal layer configured as an input port and, coupled to the input port, a radial signal splitter.

In an embodiment, the output surface has a metal layer configured as an output port and, coupled to the output port, a radial signal combiner coupled to each surface mounted power amplifier die.

Another aspect of the invention which provides scaling is an article of manufacture including a stacked plurality of glass substrates each one of which has a plurality of radio frequency (RF) power amplifier dice; at least one coaxially arranged pair of a signal splitter, and a signal combiner; and some of the plurality of power amplifier dice surface mounted to its output surface, wherein an RF output port of a first substrate is aligned with an RF input port of a second substrate enabling electrical coupling.

It is understood by circuit designers that the output of each power amplifier is coupled to a signal combiner and the input is coupled to a signal splitter and the usual power and grounds are provided to each active device to enable operation. It is understood that the signal coupling may be direct such as by Wilkinson or by transformer electromagnetic AC coupling.

CONCLUSION

The claimed subject matter is easily distinguished from conventional amplifiers with lossy longer leads. In a conventional system the splitter and combiner are not arranged coaxially.

The advantage of the claimed subject matter is enabling stacking power amplifier dice vertically to provide shorter leads and smaller footprint on the printed circuit board.

I claim:

1. An article of manufacture comprising:
   a plurality of radio frequency (RF) power amplifier dice:
   at least one coaxially arranged pair of a signal splitter, and a signal combiner;
   at least one glass substrate on which is surface mounted all or some of the plurality of RF power amplifier dice; and
   at least one thermal via to conduct heat away from the vicinity of the plurality of RF power amplifier dice.

2. The article of claim 1, wherein a first glass substrate comprises:
   a first metal layer configured as the signal splitter and
   a second metal layer configured as the signal combiner.

3. The article of claim 1, wherein
   a first glass substrate comprises a first metal layer configured as the signal splitter; and
   a second glass substrate comprises a second metal layer configured as the signal combiner.

4. The article of claim 1, wherein
   a first glass substrate has an output surface on which is surface mounted the plurality of RF power amplifier dice and an input surface.

5. The article of claim 4 wherein the input surface comprises:
   a metal layer configured as an input port and, coupled to the input port,
   a radial signal splitter.

6. The article of claim 4 wherein the output surface comprises:
   a metal layer configured as an output port and, coupled to the output port,
   a radial signal combiner coupled to each of the plurality of surface mounted RF power amplifier die.

7. An article of manufacture comprising:
   a stacked plurality of glass substrates each one of which comprises a plurality of radio frequency (RF) power amplifier dice;
   at least one coaxially arranged pair of a signal splitter, and a signal combiner; and
   some of the plurality of RF power amplifier dice surface mounted to its output surface, wherein an RF output port of a first substrate is aligned with an RF input port of a second substrate enabling electrical coupling.

8. An article of manufacture to provide a stackable power amplifier cell comprising:
   a glass substrate comprising a plurality of power output vias (output vias); the output vias coupled to,
   a radial combiner lithographically fabricated on the output surface of the glass substrate, whereby the center of the radial combiner provides an output port for the article suitable for soldering to a printed circuit board;
   a radial splitter (splitter) lithographically fabricated on the input surface of the glass substrate;
   a plurality of power amplifier dice surface mounted to the radial splitter and coupled to the output vias;
   an RF input pad surface mounted to the center of the splitter, suitable for soldering to a center of a radial combiner of an other stackable power amplifier cell; and
   a plurality of other vias for transferring ground, VDD, and thermal conduction across the glass substrate.

* * * * *